US006996662B2

(12) United States Patent
Miller et al.

(10) Patent No.: US 6,996,662 B2
(45) Date of Patent: Feb. 7, 2006

(54) CONTENT ADDRESSABLE MEMORY ARRAY HAVING FLEXIBLE PRIORITY SUPPORT

(75) Inventors: Michael J. Miller, Saratoga, CA (US); Mark Baumann, Campbell, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 691 days.

(21) Appl. No.: 09/884,797

(22) Filed: Jun. 18, 2001

(65) Prior Publication Data

US 2003/0005146 A1 Jan. 2, 2003

(51) Int. Cl.
*G06F 12/00* (2006.01)

(52) U.S. Cl. ........................................ 711/108; 365/49

(58) Field of Classification Search ................ 711/108; 365/49–50

See application file for complete search history.

(56) References Cited

U.S. PATENT DOCUMENTS 5,467,319 A * 11/1995 Nusinov et al. ............ 365/231
6,249,467 B1 * 6/2001 Pereira et al. .............. 365/200
6,687,785 B1 2/2004 Pereira

OTHER PUBLICATIONS

Article entitled "A Longest Prefix Match Search Engine for Multi-Gigabit IP Processing", Masayoshi Kobayashi et al., ©2000 IEEE.

* cited by examiner

*Primary Examiner*—Matthew D. Anderson
(74) *Attorney, Agent, or Firm*—Bever, Hoffman & Harms, LLP

(57) ABSTRACT

A method for processing addresses having variable prefix lengths, including (1) applying an input address to a plurality of CAM blocks; (2) assigning different sets of CAM blocks to store prefixes of different lengths; (3) generating a hit signal and an index signal with each of the CAM blocks in response to the input address; (4) programming a plurality of routing values; (5) routing the hit signals to a priority encoder in an order determined by the routing values; (6) generating an output hit signal with the priority encoder in response to the hit signals; (7) selecting one of the routing values as an index routing value in response to the output hit signal; and (8) routing one of the index signals as an output index value in response to the index routing value. Circuitry for implementing the method is also provided.

24 Claims, 5 Drawing Sheets

CONTENT ADDRESSABLE MEMORY ARRAY HAVING FLEXIBLE PRIORITY SUPPORT

BACKGROUND OF THE INVENTION

1. Field of the Invention

The present invention relates to content addressable memory (CAM) arrays. More specifically, the present invention relates to CAM arrays having a longest prefix match capability.

2. Discussion of Related Art

Conventional Internet protocol (IP) addresses include Class A, Class B and Class C addresses, each having a length of 32-bits. FIG. 1 is a block diagram illustrating Class A IP address 101, Class B IP address 102 and Class C IP address 103.

Class A addresses, such as Class A address 101, are identified by a logic “0” bit at bit location [0] (i.e., the most significant bit location). The next seven bits of Class A address 101 (i.e., bits [1:7]), along with the first bit (i.e., bit [0]), define a network address, and the last 24 bits of Class A address 101 (i.e., bits [8:31]) define a host address within the network. The set of Class A addresses are therefore capable of defining 128 networks, each having 224 hosts.

Similarly, Class B addresses, such as Class B address 102, are identified by logic “10” bits at bit locations [0:1] (i.e., the two most significant bit locations). The next 14 bits of Class B address 102 (i.e., bits [2:15]), along with the first two bits (i.e., bits [0:1]), define a network address, and the last 16 bits of Class B address 102 (i.e., bits [16:31]) define a host address. The set of Class B addresses are therefore capable of defining $2^{14}$ networks, each having $2^{16}$ hosts.

Finally, Class C addresses, such as Class C address 103, are identified by logic “110” bits at bit locations [0:2] (i.e., the three most significant bit locations). The next 21 bits of Class C address (i.e., bits [3:23]), along with the first three bits (i.e., bits [0:2]), define a network address, and the last 8 bits of Class C address (i.e., bits [24:3]) define a host address. The set of Class C addresses are therefore capable of defining $2^{21}$ 221 networks, each having 256 hosts.

Growth of the Internet has resulted in a shortage of Class A, Class B and Class C IP addresses. This shortage of IP addresses, in turn, has resulted in routing difficulties. In response, Classless Inter-Domain Routing (CIDR) has been developed to help relieve these routing difficulties. CIDR allows for the flexible allocation of network and host addresses within a 32-bit IP address. For example, CIDR allows the network address, which is hereinafter referred to as a “prefix”, to be defined by the first N bits of the 32-bit IP address, where N is an integer less than 32. The host address is then defined by the last M bits of the 32-bit IP address, wherein M is equal to 32 minus N. The most common values of N are in the range of 13 to 27, inclusive. CIDR advantageously expands the number of IP addresses available within a 32-bit field, and allows for improved allocation of IP addresses.

CIDR addresses are processed using a “longest prefix match” algorithm, which is typically implemented using a content addressable memory (CAM) array.

FIG. 2 is a block diagram of a conventional router 20 used to process CIDR addresses. As described below, router 20 implements a longest prefix match algorithm. Router 20 includes input port 201, CAM array 202, priority encoder 230, SRAM array 240, output switch 250 and output ports 261–264. CAM array 202 is logically divided into CAM sub-arrays 208–228. Each of CAM sub-arrays 208–228 is dedicated to store prefixes of a predetermined length. For example, CAM sub-array 228 is configured to store 28-bit prefixes, CAM sub-array 225 is configured to store 25-bit prefixes, and CAM sub-array 208 is configured to store 8-bit prefixes. Within CAM array 202, longer prefixes are assigned a higher priority than shorter prefixes. CAM sub-arrays 208–228 are arranged in order of priority, from highest-priority CAM sub-array 228, which stores 28-bit prefixes, to lowest-priority CAM sub-array 208, which stores 8-bit prefixes. Within each of CAM sub-arrays 208–228, the prefixes are arranged in order from highest priority to lowest priority. Thus, the first entry of CAM sub-array 228 stores the highest priority 28-bit prefix and the last entry of CAM sub-array 228 will store the lowest priority 28-bit prefix.

An input packet ($PACKET_{IN}$) that includes a 32-bit CIDR address (CIDR[31:0]) is applied to input port 201. In response, input port 201 provides the CIDR[31:0] address to CAM array 202. In response, CAM sub-arrays 208–228 will assert match signals for each prefix that matches the corresponding bits of the applied address CIDR[31:0]. These match signals are provided to priority encoder 230. In response, priority encoder 230 provides an INDEX signal representative of the asserted match signal having the highest priority. The INDEX signal is used as an address to access a corresponding entry of SRAM array 240. The entry retrieved from SRAM 240 includes an output port number, which is provided to output switch 250. In response, output switch 250 routes selected portions of the input packet to one of the output ports 661–664 as an output packet ($PACKET_{OUT}$). Although only four output ports 261–264 are illustrated, it is understood that router 20 typically includes many more output ports.

CAM array 202, which has a finite capacity, is initially allocated to implement CAM sub-arrays 208–228 having fixed, predetermined sizes. For example, each of CAM sub-arrays 208–228 may be allocated to include 4 k (4096) entries. This allocation is intended to provide extra capacity in each CAM sub-array to allow for the addition of new prefixes. For example, each of CAM sub-arrays 213–227 may initially be programmed to store about 3 k prefixes. In this example, each of CAM sub-arrays 208–228 includes an unused capacity of about 1 k entries, which is allocated to allow for the addition of new prefixes in the future. However, by allocating each of CAM sub-arrays 208–228 in this manner, one quarter of the available capacity (and layout area) of CAM array 202 is initially unused.

Moreover, the unused capacity of CAM sub-arrays 208–228 may be improperly allocated in view of the actual prefixes subsequently added to CAM array 202. For example, a relatively large number (i.e., >1 k) of additional 27-bit prefixes may need to be added to CAM sub-array 227, while zero additional 8-bit CIDR prefixes may need to be added to CAM sub-array 208. In this case, CAM sub-array 227 would have insufficient capacity, while CAM sub-array 213 would have extra capacity. As a result, CAM array 202 would have to be completely re-allocated. Such re-allocation is time consuming and inefficient.

In addition, SRAM array 240 is initially allocated in the same manner as CAM array 202. As a result, SRAM array 240 must be re-allocated whenever CAM array 202 is re-allocated. Again, such re-allocation is time consuming and inefficient.

It would therefore be desirable to have an improved router look-up table for more efficiently implementing longest prefix match comparisons.

SUMMARY

Accordingly, the present invention provides an improved router look-up table for processing addresses (such as CIDR addresses) having variable prefix lengths. In one embodiment, the router look-up table includes a plurality of CAM blocks, each configured to provide a hit signal and an index signal in response to an applied address. Different sets of one or more CAM blocks are assigned to store prefixes having different lengths. For example, a first set of one or more of the CAM blocks is assigned to store prefixes having a first length, and a second set of one or more CAM blocks is assigned to store prefixes having a second length, different than the first length.

A cross-point switch is also provided. In one embodiment, the cross-point switch includes a set of multiplexers, with one multiplexer being provided for each of the CAM blocks. Each multiplexer is coupled to receive the hit signals from all of the CAM blocks. Thus, each multiplexer is capable of routing any one of the hit signals.

Each of the multiplexers routes one of the hit signals in response to a corresponding routing value stored in a corresponding a storage element. The routing values are user-programmable, such that a user can control the manner in which the first set of multiplexers routes the hit signals. In general, the routing values are selected such that the hit signals are routed in order of highest priority hit signals to lowest priority hit signals.

A priority encoder is coupled to receive the hit signals routed by the multiplexers. In response, the priority encoder provides an output hit signal that corresponds with the asserted hit signal having the highest priority.

A first multiplexer is configured to route one of the routing values from the storage elements as an index control value in response to the output hit signal. A second multiplexer is configured to route one of the index signals from the CAM blocks as an output index value in response to the index control signal. The output index signal corresponds with the highest priority matching prefix in the CAM blocks. The output index signal and the output hit signal are provided as output signals of the router look-up table.

Because the user can control the manner in which the hit signals and index signals are routed, the CAM blocks can be flexibly allocated to store prefixes having different lengths. Thus, it is not necessary for all prefixes having the same length to be stored in adjacent CAM blocks.

Another embodiment includes a method for processing CIDR addresses having variable prefix lengths. This method includes (1) applying a CIDR address to a plurality of CAM blocks; (2) assigning different sets of CAM blocks to store prefixes of different lengths; (3) generating a hit signal and an index signal with each of the CAM blocks in response to the CIDR address; (4) routing the hit signals to a priority encoder in an order determined by user-programmed routing values; (5) generating an output hit signal with the priority encoder in response to the hit signals; (6) selecting one of the routing values as an index routing signal in response to the output hit signal; and (7) routing one of the index signals as an output index signal in response to the index routing signal.

In yet another embodiment, prefixes are stored in the CAM blocks according to priority chains exhibited by the prefixes. A priority chain exists for a group of prefixes having different lengths if a common input address results in a hit for each of the prefixes in the group. In this embodiment, each prefix in a priority chain is stored in a different CAM block, in an order determined by the priority (lengths) of the prefixes. Different priority chains may extend through the same CAM blocks, such that each CAM block can store prefixes having different lengths. In this manner, a relatively large number of prefixes can be stored in a relatively small number of CAM blocks.

The present invention will be more fully understood in view of the following description and drawings.

DETAILED DESCRIPTION

Figure 1:
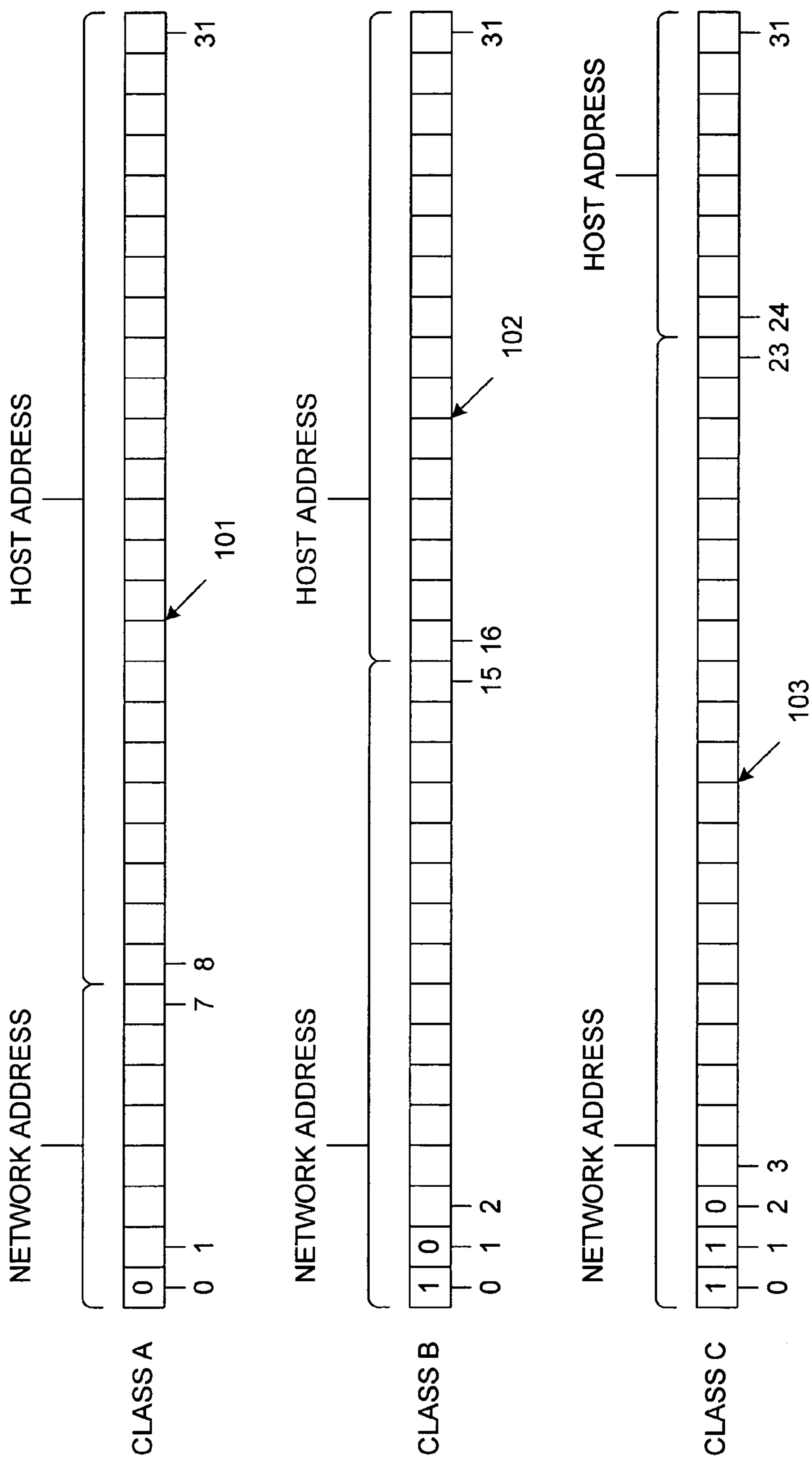
FIG. 1 is a block diagram of conventional Class A, B and C IP addresses.
Figure 2:
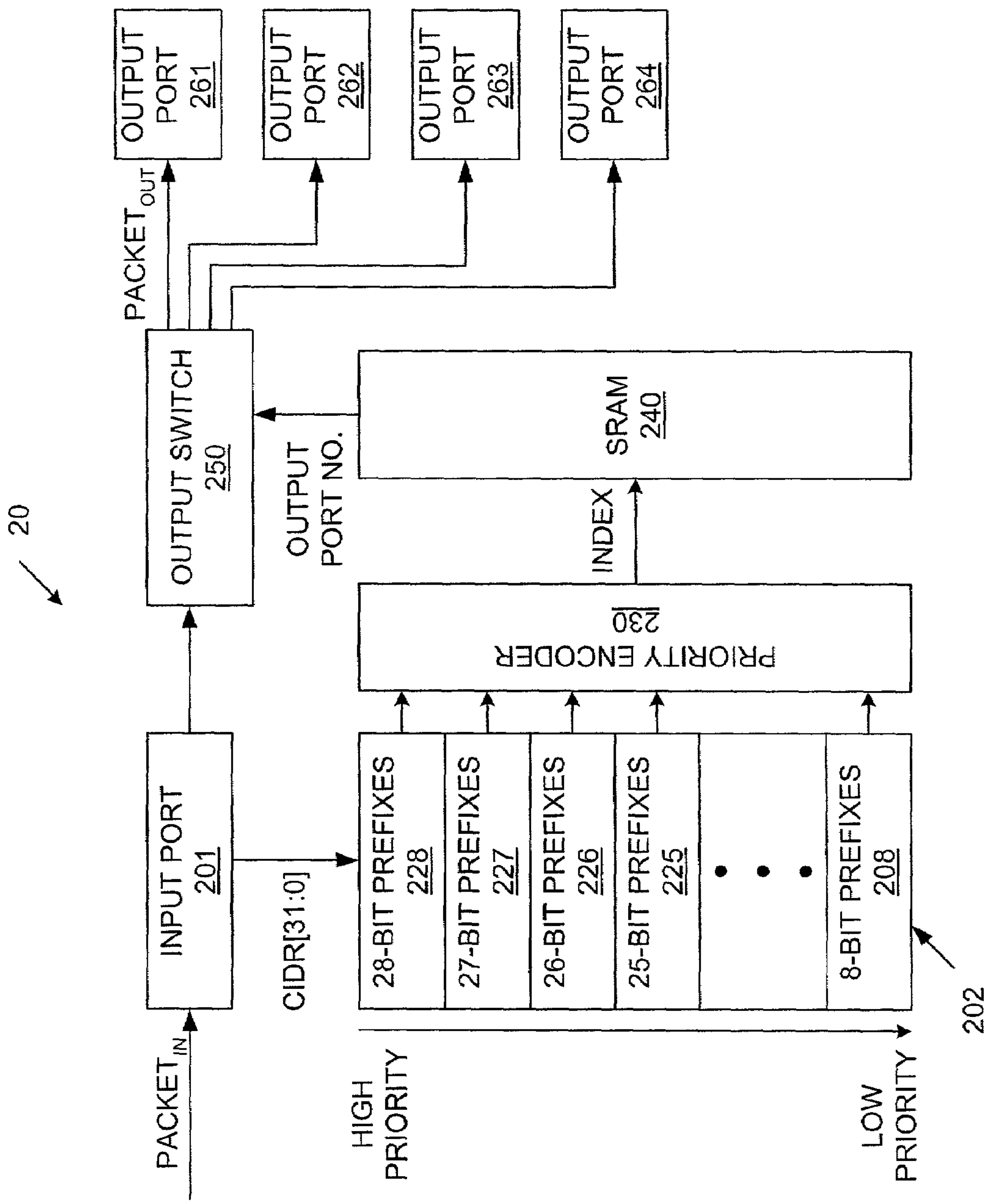
FIG. 2 is a block diagram of a conventional router look-up table for implementing a longest prefix match operation.
Figure 3:
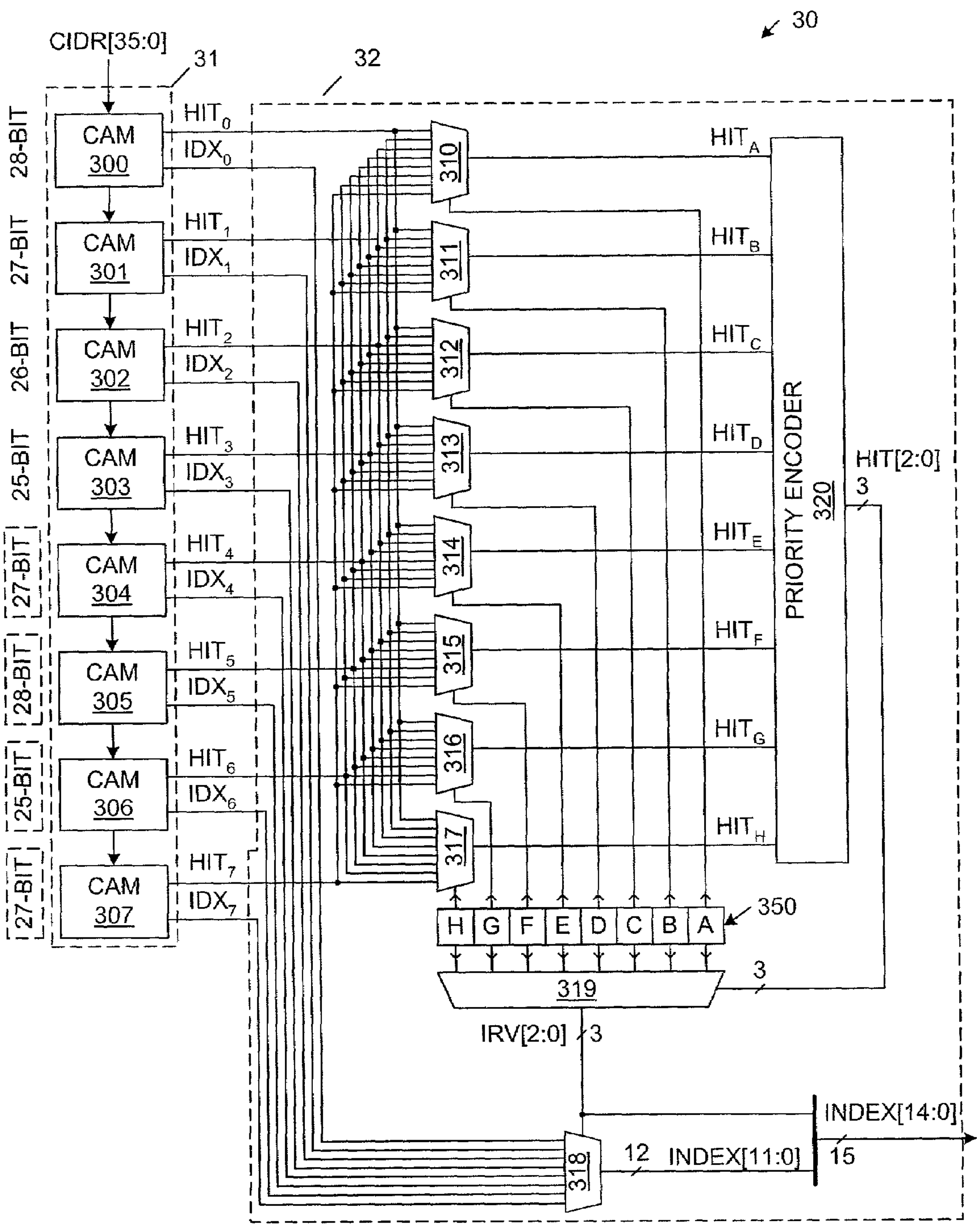
FIG. 3 is a block diagram of a CAM system that is configured to implement a longest prefix match or classification operation in accordance with one embodiment of the present invention.

FIG. 3 is a block diagram of a CAM system 30, which is configured to implement longest prefix match operations (or other classification operations) in accordance with one embodiment of the present invention. CAM system 30 includes CAM array 31 and encoding logic 32. CAM array 31 includes CAM blocks 300–307, and encoding logic 32 includes multiplexers 310–319, priority encoder 320, and register 350. Each of CAM blocks 300–307 includes an array of CAM cells and a priority encoder (not shown). Other numbers of CAM blocks can be used in other embodiments. In the described embodiment, each of CAM blocks 300–307 has a capacity of 4 k entries. However, CAM blocks 300–307 can have other capacities, including dissimilar capacities, in other embodiments.

Each of CAM blocks 300–307 in CAM array 31 is coupled to receive an input address, such as a CIDR address (CIDR[35:0]) from an input register (not shown). CIDR[35:0] address includes a 32-bit CIDR address and a 4-bit incoming port number.

Each of CAM blocks 300–307 stores data structures having a predetermined priority. In the described example, each of CAM blocks 300–307 stores CIDR prefixes having a predetermined prefix length. In the present example, CAM block 300 stores 28-bit prefixes, CAM block 301 stores 27-bit prefixes, CAM block 302 stores 26-bit prefixes and CAM block 303 stores 25-bit prefixes. In the described example, CAM blocks 304–307 are not initially designated to store prefixes of any particular length. As described below, CAM blocks 304–307 are subsequently assigned to store prefixes of particular lengths in response to the requirements of the router look-up table. For example, if more than 4 k 27-bit prefixes are required, then one (or more) of CAM blocks 304–307 can be assigned to store additional 27-bit prefixes.

CAM blocks 300–307 provide corresponding hit signals $HIT_0$–$HIT_7$ and corresponding index signals $IDX_0$–$IDX_7$ in response to the CIDR[35:0] address signal. The $HIT_0$–$HIT_7$ signals are 1-bit signals that are asserted if any hit occurs in corresponding CAM arrays 300–307, respectively. The $IDX_0$–$IDX_7$ signals are 12-bit signals that identify the highest priority entries in CAM blocks 300–307, respectively, that result in a match when compared with the CIDR[35:0] address signal.

Each of the $HIT_0$–$HIT_7$ signals is provided to each of multiplexers 310–317. Multiplexers 310–317 form a cross-point switch that is controlled by 3-bit routing values A–H, respectively, which are stored in user-programmable register 350. Each of multiplexers 310–317 routes one of the applied hit signals $HIT_0$–$HIT_7$ in response to the corresponding routing value. The hit signals routed by multiplexers 310–317 are labeled as hit signals $HIT_A$–$HIT_H$, respectively. In general, each of the routing values A–H is selected to have a unique 3-bit value when all of CAM blocks 300–307 are in use. The user of CAM system 30 selects routing values A–H in a manner that is described below.

Table 1 defines the manner in which each of multiplexers 310–317 routes the $HIT_0$–$HIT_7$ signals in response to a corresponding routing value.

TABLE 1

| ROUTING VALUE | MUX OUTPUT |
|---|---|
| 000 | $HIT_0$ |
| 001 | $HIT_1$ |
| 010 | $HIT_2$ |
| 011 | $HIT_3$ |
| 100 | $HIT_4$ |
| 101 | $HIT_5$ |
| 110 | $HIT_6$ |
| 111 | $HIT_7$ |

Priority encoder 320 is coupled to receive the $HIT_A$–$HIT_H$ signals passed by multiplexers 310–317. In response, priority encoder 320 provides a 3-bit output signal, HIT[2:0], which identifies the asserted hit signal having the highest priority. The routing values A–H are selected such that the $HIT_A$–$HIT_H$ signals are arranged in order from highest priority to lowest priority. That is, the $HIT_A$ signal is provided by the CAM block having the highest priority, the $HIT_B$ signal is provided by the CAM block having the second highest priority, and the $HIT_H$ signal is provided by the CAM block having the lowest priority.

Table 2 below defines the HIT[2:0] signal provided by priority encoder 320 in response to the hit signals $HIT_A$–$HIT_H$. Note that the symbol "x" indicates a "don't care" value in Table 2.

TABLE 2

| $HIT_A$–$HIT_H$ | HIT [2:0] |
|---|---|
| 1xxx xxxx | 000 |
| 01xx xxxx | 001 |
| 001x xxxx | 010 |
| 0001 xxxx | 011 |
| 0000 1xxx | 100 |
| 0000 01xx | 101 |
| 0000 001x | 110 |
| 0000 0001 | 111 |

The HIT[2:0] signal is provided to the control terminals of multiplexer 319. The input terminals of multiplexer 319 are coupled to receive routing values A–H from register 350. Multiplexer 319 routes one of the routing values A–H from register 350 to multiplexer 318 as the 3-bit index routing value IRV[2:0] in response to the HIT[2:0] signal provided by priority encoder 320. Table 3 below defines the manner in which routing values are passed by multiplexer 319 in response to the HIT[2:0] signal.

TABLE 3

| HIT [2:0] | ROUTING VALUE PASSED |
|---|---|
| 000 | A |
| 001 | B |
| 010 | C |
| 011 | D |
| 100 | E |
| 101 | F |
| 110 | G |
| 111 | H |

Thus, multiplexer 319 is controlled to pass the routing value responsible for routing the highest priority asserted hit signal to priority encoder 320.

The input terminals of multiplexer 318 are coupled to receive the index signals $IDX_0$–$IDX_7$ from CAM arrays 300–307, and the control terminals of multiplexer 318 are coupled to receive the index routing value IRV[2:0]. Multiplexer 318 passes one of the index signals $IDX_0$–$IDX_7$ as the 12-bit output index signal INDEX[11:0] in response to the index routing value IRV[2:0]. Table 4 below defines the manner in which index signals $IDX_0$–$IDX_7$ are routed by multiplexer 318 in response to the index routing value IRV.

TABLE 4

| IRV [2:0] | INDEX [11:0] |
|---|---|
| 000 | $IDX_0$ |
| 001 | $IDX_1$ |
| 010 | $IDX_2$ |
| 011 | $IDX_3$ |
| 100 | $IDX_4$ |
| 101 | $IDX_5$ |
| 110 | $IDX_6$ |
| 111 | $IDX_7$ |

In this manner, multiplexer 318 is controlled to pass the index signal associated with the highest priority asserted hit signal. The output index signal INDEX[11:0] and the index routing value IRV[2:0] signal are provided as the output index signal INDEX[14:0] of CAM system 30. The INDEX [14:0] signal is used to generate a next-hop routing address in a manner known to those of ordinary skill in the art.

CAM system 30 operates in the following manner in accordance with one embodiment of the present invention. CAM blocks 300–303 are programmed to store 28-bit, 27-bit, 26-bit and 25-bit CIDR prefixes, respectively. Mask registers (not shown) in CAM blocks 300–303 are programmed such that bit locations in CAM blocks 300–303 that do not store relevant prefix information are treated as "don't care" locations. CAM blocks 304–307 do not initially store any CIDR prefixes. Rather, these CAM blocks 304–307 are programmed to store a default value that will not result in the assertion of hit signals $HIT_4$–$HIT_7$, regardless of the value of the CIDR[35:0] signal. As described in more detail below, CAM blocks 304–307 provide extra storage capacity if CAM blocks 300–303 become full. It is important to note that the present example is not intended to be limiting. It is understood that CAM system 30 can be allocated in many other ways.

In a longest prefix match operation, longer prefixes have a higher priority than shorter prefixes. Thus, the $HIT_0$ and $IDX_0$ signals (28-bit prefix match) have the highest priority, followed in order by the $HIT_1$ and $IDX_1$ signals (27-bit prefix match), the $HIT_2$ and $IDX_2$ signals (26-bit prefix match) and the $HIT_3$ and $IDX_3$ signals (25-bit prefix match). The user of CAM system 30 must therefore program routing values A–D in register 350 in response to these priorities. The user therefore programs routing values A, B, C and D to have values of "000", "001", "010", and "011", such that the $HIT_0$, $HIT_1$, $HIT_2$ and $HIT_3$ signals are routed as the $HIT_A$, $HIT_B$, $HIT_C$ and $HIT_D$ signals, respectively (Table 1). Routing values E, F, G and H are each programmed to a default value of "111".

A first CIDR[35:0] address is subsequently applied to CAM blocks 300–307. In the described example, the first CIDR address matches a 27-bit prefix stored in row 215 of CAM block 301 and a 26-bit prefix stored in row 2 of CAM block 302. Thus, the $HIT_1$ and $HIT_2$ signals are asserted high (and the $HIT_0$ and $HIT_3$–$HIT_7$ signals are de-asserted low). The $IDX_1$ and $IDX_2$ signals have values of "0000 1101 0111" (i.e., 215) and "0000 0000 0010" (i.e., 2), respectively.

Multiplexers 310–313 route the $HIT_0$–$HIT_3$ signals as the $HIT_A$–$HIT_D$ signals, respectively, in response to the routing signals A–D. Multiplexers 314–317 route the $HIT_7$ signal in response to the routing signals E–H. The $HIT_B$ signal is the highest priority asserted hit signal provided to priority encoder 320. As a result, priority encoder 320 provides a HIT[2:0] signal having a value of "001" (Table 2).

In response to the HIT[2:0] signal having a value of "001", multiplexer 319 passes the routing value B (i.e., "001") as the index routing value IRV[2:0] (Table 3). This index routing value IRV[2:0] is provided to the control terminal of multiplexer 318. In response, multiplexer 318 routes the index value $IDX_1$ as the output index signal INDEX[11:0] (Table 4). This index signal INDEX[11:0] and the index routing value signal IRV[2:0] are provided as the output index signal INDEX[14:0]. The INDEX[14:0] signal identifies the highest priority CAM block that experienced a hit condition (i.e., CAM block 301), and the highest priority address in that CAM block that experienced a hit condition (i.e., row 215).

In the present example, additional CIDR addresses are added to the system, thereby requiring that additional 27-bit prefixes be stored in CAM system 30. In the described example, 27-bit prefixes are added to CAM block 301 until this block is full. Additional 27-bit prefixes are then stored in CAM block 304. Advantageously, the original contents of CAM blocks 300–303 do not need to be re-written or moved.

The routing values stored in register 350 must be revised in consideration of the storage of 27-bit prefixes in CAM block 304. Because CAM block 300 continues to store the only 28-bit prefixes, this CAM block 300 retains the highest priority. As a result, routing value A remains at value of "000", such that the $HIT_0$ signal continues to be routed as the $HIT_A$ signal.

Because CAM block 301 continues to store 27-bit prefixes, this CAM block 301 retains the second highest priority. Consequently, routing value B remains at a value of "001", such that the $HIT_1$ signal continues to be routed as the $HIT_B$ signal.

However, CAM block 304 now stores 27-bit prefixes, thereby giving the $HIT_4$ and $IDX_4$ signals provided by this CAM block the third highest priority. Consequently, within register 350, routing value C (which controls multiplexer 312) is programmed to have a value of "100", such that the $HIT_4$ signal is now routed as the $HIT_C$ signal. This configuration effectively gives CAM block 304 the third highest priority.

Because CAM block 302 continues to store 26-bit prefixes, this CAM block 302 now has the fourth highest priority. Consequently, within register 350, routing value D (which controls multiplexer 313) is programmed to have a value of "010", such that the $HIT_2$ signal is now routed as the $HIT_D$ signal. This configuration effectively gives CAM block 302 the fourth highest priority.

Similarly, because CAM block 303 continues to store 25-bit prefixes, this CAM block 303 now has the fifth highest priority. Consequently, within register 350, routing value E (which controls multiplexer 314) is programmed to have a value of "011", such that the $HIT_3$ signal is now routed as the $HIT_E$ signal. This configuration effectively gives CAM block 303 the fifth highest priority. Because CAM blocks 305–307 remain unused, routing values F–H each remain at a value of "111".

Under this configuration, hit conditions in CAM array 304 will have priority over hit conditions in CAM arrays 302 and 303. For example, assume a second address CIDR[35:01] applied to CAM blocks 300–307 matches a 27-bit prefix stored in row 124 of CAM block 304, a 26-bit prefix stored in row 27 of CAM block 302 and a 25-bit prefix stored in row 1532 of CAM block 303. In this case, the $HIT_2$, $HIT_3$ and $HIT_4$ signals are asserted high (and the $HIT_0$–$HIT_1$ and $HIT_5$–$HIT_7$ signals are de-asserted low).

Multiplexers 310 and 311 route the logic low $HIT_0$ and $HIT_1$ signals as the $HIT_A$ and $HIT_B$ signals, respectively, in response to the routing values A and B. Multiplexers 312, 313 and 314 route the logic high $HIT_4$, $HIT_2$ and $HIT_3$ signals signal as the $HIT_C$, $HIT_D$, and $HIT_E$ signals, respectively, in response to the new routing values C, D and E, respectively. Thus, the $HIT_C$, $HIT_D$ and $HIT_E$ signals, which are associated with 27-bit, 26-bit and 25-bit prefixes, respectively, are effectively shifted and provided to priority encoder 320 in the appropriate order.

The $HIT_C$ signal has the highest priority of the asserted hit signals, thereby causing priority encoder 320 to provide a HIT[2:0] having a value of "010" (Table 2). In response to this HIT[2:0] signal, multiplexer 319 passes routing value C (i.e., "100") as the index routing value IRV[2.0] (Table 3). In response to this index routing value IRV[2:0], multiplexer 318 properly passes the index signal $IDX_4$ (Table 4). As a result, the IRV[2:0] signal (i.e., "100") and the index signal IDX4 (i.e., "000 0111 1100") are routed as the output index signal INDEX[14:0]. The appropriateness of passing the IRV[2:0] signal, rather than the HIT[2:0] signal, is discussed below.

Figure 4:
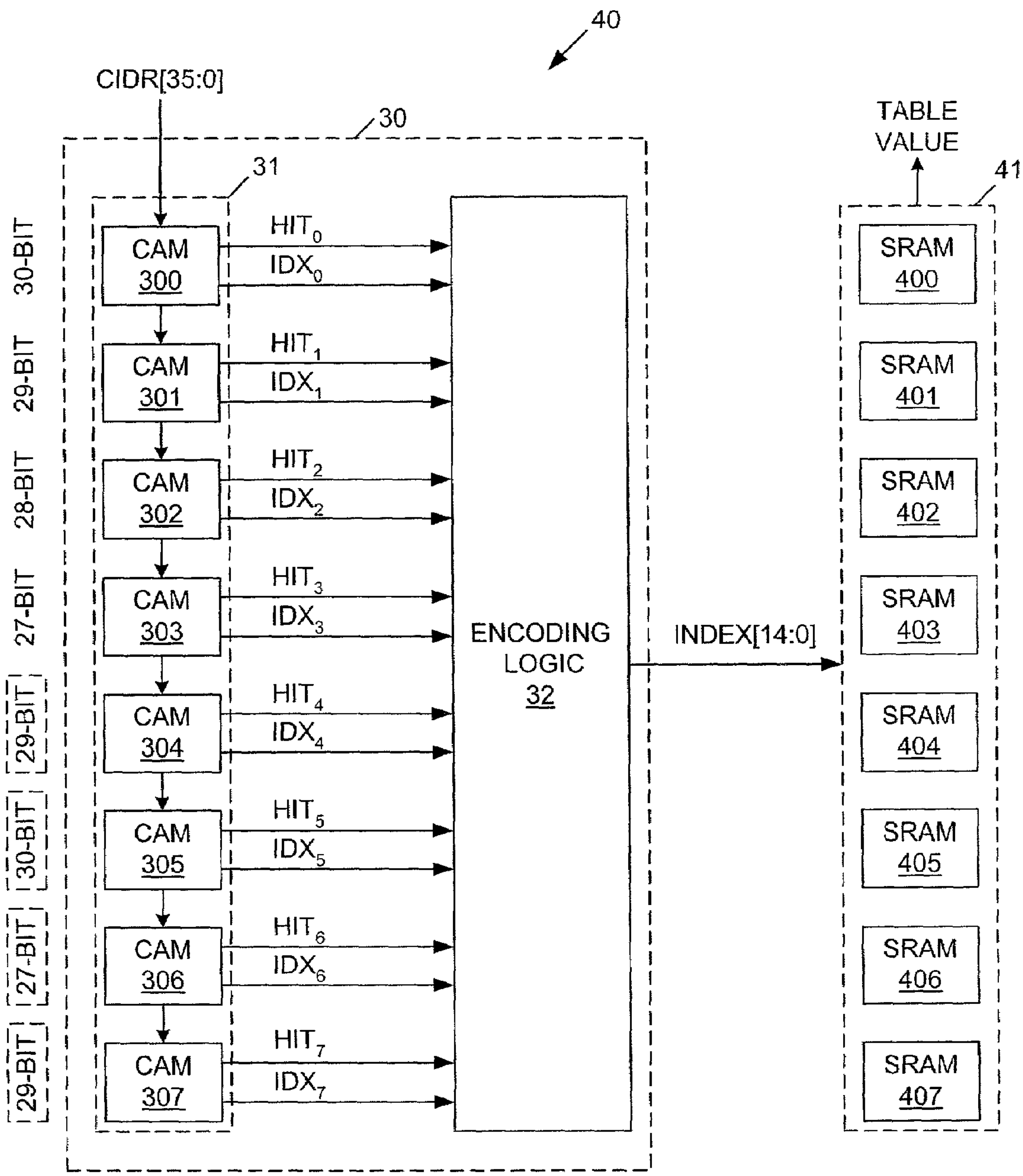
FIG. 4 is a block diagram of a router look-up table that includes the CAM system of FIG. 3 and an SRAM array in accordance with one embodiment of the present invention.

FIG. 4 is a block diagram illustrating a router look-up table 40, which includes CAM system 30 coupled to an SRAM array 41. SRAM array 41 is coupled to receive the INDEX[14:0] signal provided by encoding logic 32. SRAM array 41 includes a plurality of SRAM blocks 400–407. Each of the SRAM blocks 400–407 corresponds with one of the CAM blocks 300–307. In the described embodiment, there is a direct correspondence between SRAM blocks 400–407 and CAM blocks 300–307, respectively. Thus, SRAM block 400 stores entries corresponding to the CIDR prefixes stored in CAM block 300, and SRAM block 407 stores entries corresponding to the CIDR prefixes stored in CAM block 307. Each entry in CAM array 31 has a corresponding entry in SRAM array 41. More specifically, each of the entries in CAM blocks 300–307 has a corresponding entry in SRAM blocks 400–407, respectively. In other embodiments, a correspondence other than a one-to-one correspondence can be provided between CAM blocks and SRAM blocks. For example, one SRAM block can be provided for every two CAM blocks. In yet other embodiments, there may be no SRAM requirement.

The correspondence between CAM blocks 300–307 and SRAM blocks 400–407 is selected before the prefix lengths are selected for all of CAM blocks 300–307. Encoding logic 32 is therefore configured to ensure that the INDEX[14:0] signal accesses the appropriate SRAM block, regardless of the prefix length assignments in CAM blocks 300–307. To accomplish this, encoding logic 32 routes the internal routing value IRV[2:0] (rather than the HIT[2:0] signal) as part of the INDEX[14:0] signal, thereby identifying the physical location of the CAM array 31 to SRAM array 41, rather than the logical location of the CAM block to SRAM array 41.

Thus, in the present example, the highest priority hit occurs in CAM block 304, which is physically located at position four (i.e., "100") in CAM array 31. However, because CAM block 304 stores 27-bit CIDR prefixes, CAM block 304 is logically located at position three (i.e., "011") in CAM array. Note that these positions assume that CAM block 300 is physically (and logically) located at position zero (i.e., "000"). In the present example, the HIT[2:0] signal identifies the logical location of CAM block 304 (i.e., "011"), but the IRV[2:0] signal identifies the physical location of CAM block 304. Thus, by passing the IRV[2:0] signal as part of the INDEX[14:0] signal, the INDEX[14:0] signal properly accesses SRAM block 404 in SRAM array 41. Thus, modifying the logical address of a CAM block has no effect on the INDEX[14:0] signal.

Continuing the present example, additional CIDR addresses can be added to the system, thereby requiring additional 28-bit prefixes and 25-bit prefixes to be stored in CAM system 30. In the described example, 28-bit prefixes are added to CAM block 300 until this block is full, and 25-bit prefixes are added to CAM block 303 until this block is full. Additional 28-bit prefixes are stored in CAM block 305, and additional 25-bit prefixes are stored in CAM block 306. In this case, the previous contents of CAM blocks 301–304 do not need to be re-written or moved.

Again, the routing values stored in register 350 must be revised in consideration of the storage of 28-bit prefixes in CAM block 305 and 25-bit prefixes in CAM block 306. Because CAM block 300 continues to store 28-bit prefixes, this CAM block 300 retains the highest priority. As a result, routing value A remains at value of "000", such that the $HIT_0$ signal continues to be routed as the $HIT_A$ signal.

However, CAM block 305 now stores 28-bit prefixes, thereby giving the $HIT_5$ and $IDX_5$ signals provided by this CAM block the second highest priority. Consequently, routing value B is programmed to have a value of "101", such that the $HIT_5$ signal is now routed as the $HIT_B$ signal. This configuration effectively gives CAM block 305 the second highest priority.

CAM blocks 301 and 304 continue to store 27-bit prefixes, thereby giving the $HIT_1$ and $IDX_1$ signals and the $HIT_4$ and $IDX_4$ signals provided by CAM block 301 and 304, respectively, the third and fourth highest priorities. Consequently, routing values C and D are programmed to have values of "001" and "100", respectively, such that the $HIT_1$ and $HIT_4$ signals are now routed as the $HIT_C$ and $HIT_D$ signals. This configuration effectively gives CAM blocks 301 and 304 the third and fourth highest priorities.

CAM block 302 continues to store 26-bit prefixes, thereby giving the $HIT_2$ and $IDX_2$ signals provided by CAM block 302 the fifth highest priority. Consequently, routing value E is programmed to have a value of "010", such that the $HIT_2$ signal is now routed as the $HIT_E$ signal. This configuration effectively gives CAM block 302 the fifth highest priority.

Finally, CAM blocks 303 and 306 now store 25-bit prefixes, thereby giving the $HIT_3$ and $IDX_3$ signals and the $HIT_6$ and $IDX_6$ signals provided by CAM blocks 303 and 306, respectively, the sixth and seventh highest priorities. Consequently, routing values F and G are programmed to have values of "011" and "110", respectively, such that the $HIT_3$ and $HIT_6$ signals are now routed as the $HIT_F$ and $HIT_G$ signals, respectively. This configuration effectively gives CAM blocks 303 and 306 the sixth and seventh highest priorities. In this manner, the $HIT_A$–$HIT_G$ signals are provided to priority encoder 320 in an appropriate order.

Continuing further with the present example, additional CIDR addresses may be added to the system, thereby requiring that additional 27-bit prefixes be stored in CAM system 30. In the described example, 27-bit prefixes are added to CAM block 304 until this block is full. Additional 27-bit prefixes are then stored in CAM block 307. Again, the present contents of CAM blocks 300–306 do not need to be re-written or moved. However, the routing values stored by register 350 must be modified in consideration of the storage of 27-bit prefixes in CAM block 307. More specifically, routing values A, B, C, D, E, F, G and H are given values of "000", "101", "001", "100", "111", "010", "011" and "110", respectively.

As a result, the $HIT_0$ and $HIT_5$ signals, which correspond with 28-bit prefixes, are routed as the $HIT_A$ and $HIT_B$ signals, respectively. The $HIT_1$, $HIT_4$ and $HIT_7$ signals, which correspond with 27-bit prefixes, are routed as the $HIT_C$, $HIT_D$ and $HIT_E$ signals, respectively. The $HIT_2$ signal, which corresponds with 26-bit prefixes, is routed as the $HIT_F$ signal. The $HIT_3$ and $HIT_6$ signals, which correspond with 25-bit prefixes, are routed as the $HIT_G$ and $HIT_H$ signals, respectively. Thus, the $HIT_A$–$HIT_H$ signals are provided to priority encoder 320 in an appropriate order.

CAM system 30 provides great flexibility in the allocation of CAM blocks 300–307. Although the examples described above start with four of CAM blocks 300–303 designated for storing CIDR prefixes, this allocation can be different in other embodiments. For example, six of the eight CAM blocks 300–307 may be dedicated for storing CIDR prefixes of six different lengths, with two CAM blocks being dedicated to store additional CIDR prefixes. Moreover, although sequential CAM blocks 300–303 have been described as storing CIDR prefixes having sequential lengths (i.e., 28-bits, 27-bits, 26-bits, 25-bits), this is not necessary. For example, CAM blocks 307, 305, 303 and 301 could be initially assigned to store 28-bit prefixes, 27-bit prefixes, 26-bit prefixes and 25-bit prefixes, respectively.

Furthermore, although CAM system 30 has been described as having eight CAM blocks, it is understood that the present invention can be implemented with other numbers of CAM blocks. For example, to implement a CAM system capable of processing CIDR addresses having prefix lengths from 28-bits to 8-bits, at least 21 main CAM blocks plus the desired number of spare CAM blocks are required. In a particular embodiment, 32 CAM blocks are used to implement a router look-up table in accordance with the present disclosure. In yet another embodiment, the CAM blocks can have different capacities. Thus, larger CAM blocks can be used to store CIDR addresses for the more popular (numerous) prefix lengths. Similarly, the spare CAM blocks may have a smaller capacity than one or more of the non-spare CAM blocks.

In other embodiments, the CAM blocks can be configured to operate in response to addresses of different lengths. For example, in the above-described embodiments, CAM system 30 is configured to operate in response to standard IPv4 addresses having a width of 36-bits (i.e., CIDR[35:0]). In another embodiment, for example, CAM system 30 can be expanded to operate in response to standard IPv6 addresses having a width of 144-bits. The present invention is applicable to process set of addresses having variable length prefixes (not only CIDR addresses). The manner of expanding CAM system 30 would be apparent to one of ordinary skill in the art.

In yet another embodiment of the present invention, the priority of the entries in CAM blocks 300–307 are not determined by prefix length, but rather, by other characteristics of the entries. Thus, entries having different prefix lengths may be stored in the same CAM block, as long as an input address does not result in multiple hits in the same CAM block. The following example will clarify this embodiment.

Figure 5:
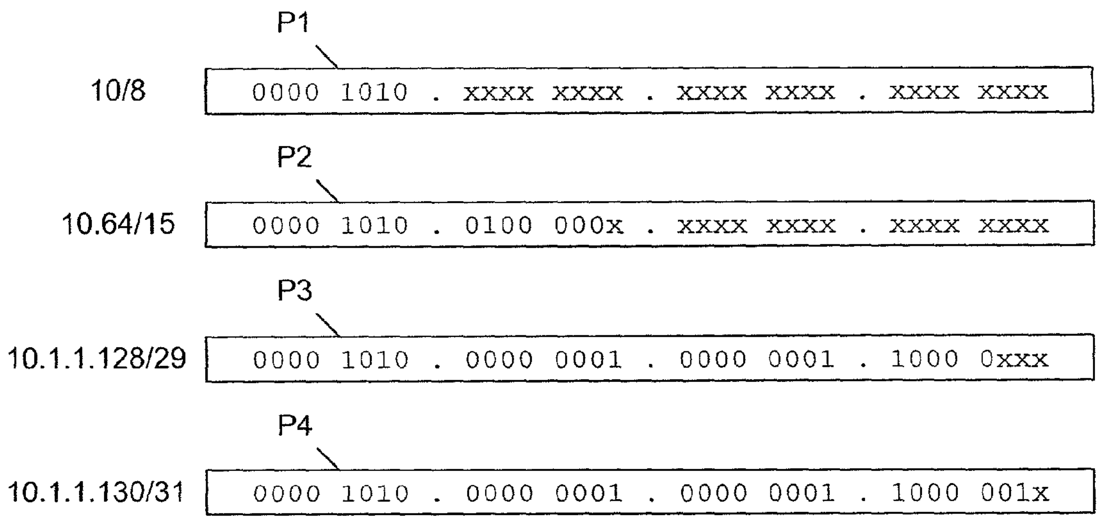
FIG. 5 is a block diagram illustrating a set of four prefixes P1–P4.

FIG. 5 is a block diagram illustrating four prefixes P1–P4, which are to be stored in CAM system 30 in accordance with the present embodiment. The first prefix P1 has a prefix length of 8-bits (with 24 "don't care" bits). The first 8-bits of the first prefix P1 have a decimal value of "10", such that the first prefix P1 can be represented as "10/8" (i.e., decimal value of 10 in the 8 most significant bit locations).

The second prefix P2 has a prefix length of 15-bits (with 17 "don't care" bits). The first 8-bits of the second prefix P2 have a decimal value of "10" and the second 8-bits of the second prefix P2 have a decimal value of "64" such that the second prefix P2 can be represented as "10.64/15" (i.e., decimal values of 10 and 64 at the 15 most significant bit locations.)

The third prefix P3 has a prefix length of 29-bits (with 3 "don't care" bits). The first 8-bits of the third prefix P3 have a decimal value of "10", the second 8-bits of the third prefix P3 have a decimal value of "1", the third 8-bits of the third prefix P3 have a decimal value of "1" and the fourth 8-bits of the third prefix P3 have a decimal value of "128", such that the third prefix P3 can be represented as "10.1.1.128/29" (i.e., decimal values of 10, 1, 1 and 128 at the 29 most significant bit locations.)

The fourth prefix P4 has a prefix length of 31-bits (with 1 "don't care" bit). The first 8-bits of the fourth prefix P4 have a decimal value of "10", the second 8-bits of the fourth prefix P4 have a decimal value of "1", the third 8-bits of the fourth prefix P4 have a decimal value of "1" and the fourth 8-bits of the fourth prefix P4 have a decimal value of "130", such that the fourth prefix P4 can be represented as "10.1.1.130/31" (i.e., decimal values of 10, 1, 1 and 130 at the 31 most significant bit locations.)

In the first embodiment described above, each of prefixes P1–P4 would be stored in a separate CAM block because each of these prefixes has a different length. However, this configuration may be more restrictive than is necessary. The present embodiment provides another approach for configuring CAM system 30.

The prefixes P1–P4 are first analyzed to determine which prefixes share the same priority chain. A group of prefixes share the same priority chain if a common input address results in a hit in each prefix in the group. Thus, an input address of "10.1.1.130" will result in a hit with the fourth prefix P4, the third prefix P3 and the first prefix P1, but not with the second prefix P2. Thus, the fourth prefix P4, the third prefix P3 and the first prefix P1 are in a first priority chain.

Furthermore, an input address of "10.64.0.0" will result in a hit with the second prefix P2 and the first prefix P1, but not with the third prefix P3 or the fourth prefix P4. Thus, the second prefix P2 and the first prefix P1 are in a second priority chain, different than the first priority chain.

Both the first and second priority chains must be retained in the configuration of CAM system 30. Thus, as dictated by the first priority chain, the fourth prefix P4 must have a higher priority than the third prefix P3, which in turn, must have a higher priority than the first prefix P1. As dictated by the second priority chain, the second prefix P2 must have a higher priority than the first prefix Pi. However, the second prefix P2 has no ordering constraint with respect to the third prefix P3 or the fourth prefix P4 (because, the second prefix P2 is not in a priority chain with either the third prefix P3 or the fourth prefix P4).

Figure 6:
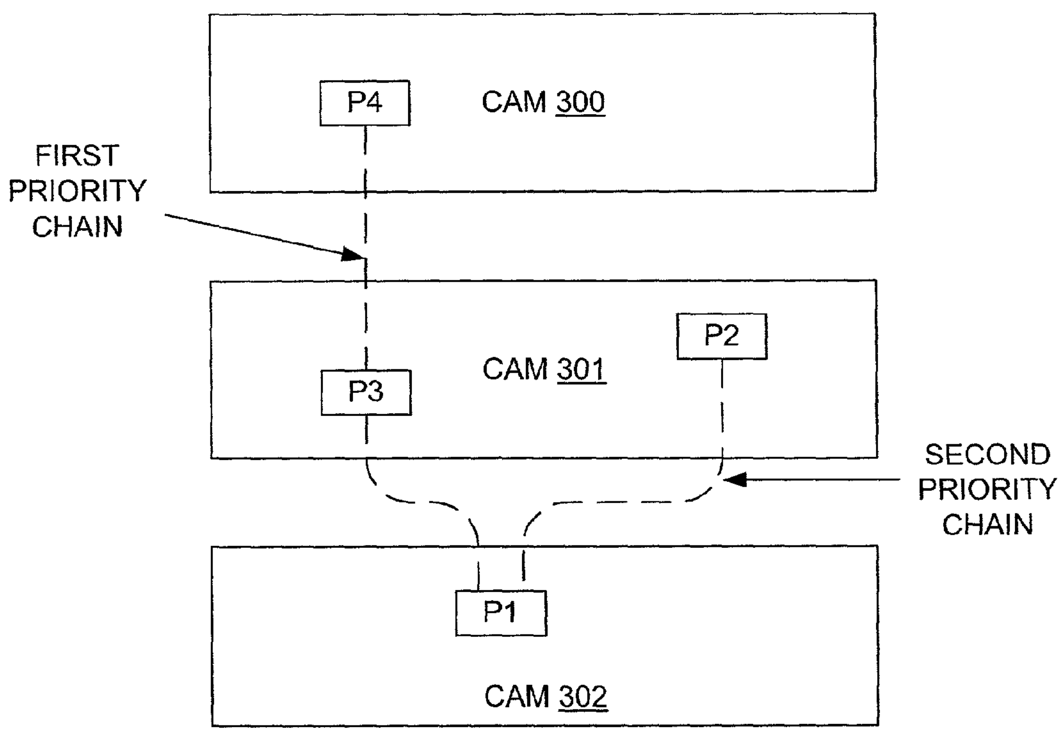
FIG. 6 is a block diagram illustrating the manner in which CAM blocks store the prefixes P1–P4 of FIG. 5 in accordance with another embodiment of the present invention.

Each prefix in a priority chain is stored in a different CAM block in accordance with the present embodiment. That is, the prefixes in a priority chain are stored in a "per block" configuration. Thus, prefixes P1–P4 may be stored in CAM system 30 in the following manner, which is illustrated in FIG. 6. The fourth prefix P4 having the highest priority in the first priority chain, may be stored in CAM block 300. The third prefix P3, which has a lower priority than the fourth prefix P4 in the first priority chain, may be stored in CAM block 301. The first prefix P1, which has a lower priority than the third prefix P3 in the first priority chain, may be stored in CAM block 302. The routing values A, B, and C are selected such that CAM block 300 has the highest priority, followed in order of priority by CAM blocks 301 and 302.

The second prefix P2, which has a higher priority than the first prefix P1 in the second prefix chain, but no relative priority with respect to the third prefix P3 or the fourth prefix P4 in the first prefix chain, may be stored in either CAM block 300 (with fourth prefix P4) or CAM block 301 (with third prefix P3).

In this manner, any one of CAM blocks 300–307 may store prefixes having different lengths, as long as these prefixes are not located in the same priority chain. Advantageously, this embodiment allows a relatively large number of prefixes to be stored in a relatively small number of CAM blocks.

Although the invention has been described in connection with several embodiments, it is understood that this invention is not limited to the embodiments disclosed, but is capable of various modifications, which would be apparent to a person skilled in the art. Thus, the invention is limited only by the following claims.

What is claimed is:

1. A system for processing addresses having variable prefix lengths, the system comprising:

a plurality of content addressable memory (CAM) blocks, each configured to provide a hit signal and an index signal in response to an applied address;

a plurality of programmable storage elements configured to store a plurality of routing values;

a configurable switching circuit coupled to receive the hit signals from the CAM blocks and the routing values from the programmable storage elements, wherein the configurable switching circuit routes the hit signals in a first order in response to the routing values;

a priority encoder coupled to receive the hit signals routed by the configurable switching circuit, the priority encoder being configured to provide an output hit signal representative of an asserted hit signal having a highest priority in the first order;

a first multiplexer configured to route one of the routing values from the programmable storage elements as an index routing value in response to the output hit signal; and a second multiplexer configured to route an index signal from one of the CAM blocks as an output index value in response to the index routing value.

2. The system of claim 1, further comprising a static random access memory (SRAM) array, wherein the index routing value and the output index value are provided to access the SRAM array.

3. The system of claim 2, wherein the SRAM array includes a plurality of SRAM blocks corresponding with the CAM blocks.

4. The system of claim 1, wherein the configurable switching circuit comprises a plurality of multiplexers, each corresponding with one of the CAM blocks, and each being coupled to receive all of the hit signals from the CAM blocks.

5. The system of claim 4, wherein each of the programmable storage elements is coupled to a corresponding one of the multiplexers, wherein each of the multiplexers routes one of the hit signals in response to the routing value stored in the corresponding programmable storage element.

6. The system of claim 1, wherein one or more of the CAM blocks is designated to store only prefixes having a first length, and one or more of the CAM blocks is designated to store only prefixes having a second length, different than the first length.

7. The system of claim 6, wherein one or more of the CAM blocks stores is designated to store only prefixes having a third length, different than the first and second lengths.

8. The system of claim 6, wherein one or more of the CAM blocks are initially designated as spare CAM blocks that do not store prefixes unless one of the other CAM blocks becomes full.

9. The system of claim 1, wherein the asserted hit signal having the highest priority and the output index value originate in the same CAM block.

10. The system of claim 1, wherein the system includes thirty-two CAM blocks.

11. The system of claim 1, wherein the addresses are Classless Inter-Domain Routing (CIDR) addresses.

12. The system of claim 1, wherein a first set of the CAM blocks is designated to store a set of prefixes of a first priority chain, wherein each of the CAM blocks in the first set is designated to store a corresponding one of the prefixes of the first priority chain.

13. The system of claim 12, wherein a second set of the CAM blocks is designated to store a set of prefixes of a second priority chain, wherein each of the CAM blocks in the second set is designated to store a corresponding one of the prefixes of the second priority chain.

14. The system of claim 13, wherein the first set of the CAM blocks and the second set of the CAM blocks share a common CAM block.

15. The system of claim 14, wherein the common CAM block stores prefixes having different lengths.

16. A method for processing addresses having variable prefix lengths, the method comprising:

storing prefixes having a first length in a first set of one or more content addressable memory (CAM) blocks;

storing prefixes having a second length in a second set of one or more CAM blocks, the second length being different than the first length;

receiving an input address with the first and second sets of CAM blocks;

generating a hit signal and an index signal with each of the CAM blocks in the first and second sets of CAM blocks in response to the input address;

storing a plurality of routing values in a programmable register;

routing the hit signal generated by each of the CAM blocks to a priority encoder in an order determined by the routing values;

generating an output hit signal with the priority encoder in response to the hit signals;

routing one of the routing values as an index routing value in response to the output hit signal; and routing one of the index signals as an output index value in response to the index routing value.

17. The method of claim 16, further comprising using the index routing value and the output index value to address a memory array.

18. The method of claim 16, further comprising selecting the routing values such that the hit signals associated with the first set of CAM blocks are routed consecutively to the priority encoder, and the hit signals associated with the second set of CAM blocks are routed consecutively to the priority encoder.

19. The method of claim 16, wherein the output hit signal is representative of an asserted hit signal having a highest priority.

20. The method of claim 19, wherein the asserted hit signal having the highest priority and the output index value originate in the same CAM block.

21. The method of claim 16, further comprising initially designating one or more CAM blocks as spare CAM blocks that do not store prefixes unless another CAM block becomes full.

22. The method of claim 16, wherein the input address is a Classless Inter-Domain Routing (CIDR) address.

23. The method of claim 16, further comprising:

storing prefixes having a third length, different than the first and second lengths, in a third set of one or more CAM blocks, receiving the input address with the third set of CAM blocks; and generating a hit signal and an index signal with each of the CAM blocks in the third set of CAM blocks in response to the input address.

24. A method for processing addresses having variable prefix lengths, the method comprising:

analyzing the addresses to identify a first priority chain having a first plurality of prefixes, and a second priority chain having a second plurality of prefixes; storing the prefixes of the first priority chain in a first set of CAM blocks, wherein each of the CAM blocks in the first set of CAM blocks stores one and only one of the prefixes of the first priority chain;

storing the prefixes of the second priority chain in a second set of CAM blocks, wherein each of the CAM blocks in the second set of CAM blocks stores one and only one of the prefixes of the second priority chain, and wherein the first set of CAM blocks shares at least one CAM block with the second set of CAM blocks;

receiving an input address with the first and second sets of CAM blocks;

generating a hit signal and an index signal with each of the CAM blocks in the first and second sets of CAM blocks in response to the input address;

storing a plurality of routing values in a programmable register;

routing the hit signal generated by each of the CAM blocks to a priority encoder in an order determined by the routing values;

generating an output hit signal with the priority encoder in response to the hit signals;

routing one of the routing values as an index routing value in response to the output hit signal; and routing one of the index signals as an output index value in response to the index routing value.

* * * * *